(12) United States Patent
Joshi et al.

(10) Patent No.: US 7,098,692 B2
(45) Date of Patent: Aug. 29, 2006

(54) SWITCHABLE POWER DOMAINS FOR 1.2V AND 3.3V PAD VOLTAGES

(75) Inventors: Sridevi R. Joshi, Irvine, CA (US); Guangming Yin, Foothill Ranch, CA (US); Mohammad Nejad, Newport Beach, CA (US); Daniel Schoch, Costa Mesa, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/078,151

(22) Filed: Mar. 11, 2005

(65) Prior Publication Data

US 2005/0156653 A1 Jul. 21, 2005

Related U.S. Application Data

(63) Continuation of application No. 10/448,640, filed on May 30, 2003, now Pat. No. 6,943,587.

(60) Provisional application No. 60/403,455, filed on Aug. 12, 2002.

(51) Int. Cl.
*H03K 19/0175* (2006.01)

(52) U.S. Cl. ............ 326/62; 326/80; 326/82; 326/81

(58) Field of Classification Search ............ 326/62–63, 326/68, 80–83, 75; 327/333, 108–112
See application file for complete search history.

(56) References Cited

U.S. PATENT DOCUMENTS

| 4,853,560 A | * | 8/1989 | Iwamura et al. | 326/80 |
| 5,506,535 A | * | 4/1996 | Ratner | 327/333 |
| 6,501,301 B1 | * | 12/2002 | Taguchi | 326/101 |

* cited by examiner

*Primary Examiner*—Anh Q. Tran
(74) *Attorney, Agent, or Firm*—Garlick Harrison & Markison; Bruce E. Garlick; Kevin L. Smith

(57) ABSTRACT

An integrated circuit includes a core circuit and a buffer circuit. The buffer circuit includes a plurality of input buffers and a plurality of output buffers that service a plurality of voltage domains on a single set of input/output lines. These voltage domains are controllable to service multiple voltage levels, consistent with various interface standards. In one construction, the core circuit operates at 1.2 volts and the buffer circuit supports both a 1.2 volts interface standard and a 3.3 volts interface standard.

12 Claims, 9 Drawing Sheets

SWITCHABLE POWER DOMAINS FOR 1.2V AND 3.3V PAD VOLTAGES

CROSS REFERENCES TO RELATED APPLICATIONS

This application is a continuation of U.S. Ser. No. 10/448,640 filed May 30, 2003, now issued as U.S. Pat. No. 6,943,587 which claims priority to U.S. Provisional Application Ser. No. 60/403,455, filed Aug. 12, 2002, which is incorporated herein by reference in its entirety for all purposes.

BACKGROUND OF THE INVENTION

1. Technical Field of the Invention

The present invention relates generally to communication systems, and more particularly to the interface between high-speed serial bit stream communication circuits having different power supply voltages.

2. Description of Related Art

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs. This structure is not unique to the Internet, however. Portions of the PSTN, wireless cellular network infrastructure, Wide Area Networks (WANs), and other communication systems also employ this same structure.

The switch hubs employ switches to route incoming traffic and outgoing traffic. A typical switch located at a switch hub includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs located in the same geographic area or to other PCBs located at another geographic area.

For example, a switch that services a building in a large city couples via fiber media to switches mounted in other buildings within the city and switches located in other cities and even in other countries. Typically, Application Specific Integrated Circuits (ASICs) are mounted upon the PCBs of the housing. These ASICs perform switching operations for the data that is received on the coupled media and transmitted on the coupled media. The coupled media typically terminates in a receptacle and transceiving circuitry coupled thereto performs signal conversion operations. In most installations, the media, e.g., optical media, operates in a simplex fashion. In such case, one optical media carries incoming data (RX data) to the PCB while another optical media carries outgoing data (TX data) from the PCB. Thus, the transceiving circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information from the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiving circuit that resides between the physical media and the ASIC must satisfy all of these requirements.

Various standardized interfaces have been employed to couple the transceiving circuit to the ASIC. These standardized interfaces include the XAUI interface, the Xenpak interface, the GBIC interface, the XGMII interface, and the SFI-5 interface, among others. The SFI-5 interface, for example, includes 16 data lines, each of which supports a serial bit stream having a nominal bit rate of 2.5 Giga bits-per-second (GBPS). Line interfaces also have their own operational characteristics. Particular high-speed line interfaces are the OC-768 interface and the SEL-768 interface. Each of these interfaces provides a high-speed serial interface operating at a nominal bit rate of 40 GBPS.

Typically, circuits that are designed to communicate with one another over an interface standard within a system are at least initially specified to operate using the same power supply voltage. This makes the electrical requirements for transmission and reception of data between the circuits simple and reliable. However, because different manufacturers often supply different components for a given system, those circuits are constantly being redesigned to improve operation. One area, which is constantly considered for improvement in communication systems, is power dissipation. The fact that many banks of printed circuit boards are housed closely together for many communication channels makes minimizing power dissipation in communications systems a critical design goal.

Therefore, as new system components (typically in the form of independent integrated circuits or chips) on one side of an interface are introduced, they may be specified to operate at a lower supply voltage than previously used in the system. Because acceptance of new component designs in communication systems is often contingent upon their compatibility with legacy circuits still being used in the field, it would be highly desirable for newly introduced circuits operating at lower supply voltages to be compatible with legacy devices to which they must interface operating at higher voltages.

It is not, however, a simple matter to render circuits electrically compatible that must communicate with one another when operating at different supply voltages. The very fact that the supply voltages are different makes it likely that, without more, the binary levels that each can produce and recognize will be incompatible. For example, a circuit operating at 3.3 volts will likely require a minimum of 2 volts at its inputs to judge the input as a binary high or "1" (i.e. $V_{IH}$). If the circuit operating at 3.3 volts attempts to interface directly with a second circuit operating at, for example 1.5 volts, the circuit operating at 1.5 volts will not have the output swing to accommodate this requirement (the best its transistors operating at 1.5 volts can do is slightly less than the 1.5 volts supply rail) for a binary one.

Moreover, the first circuit operating at 3.3 volts could produce an output high (i.e. VOH) that could be as high as just below its 3.3 volts supply rail. If this voltage is fed into transistors operating at 1.5 volts on the second circuit (or chip), the transistors operating at the lower supply voltage will likely break down and are destroyed. The maximum low state output (i.e. $V_{OL}$ max) produced by the first circuit operating at 3.3 volts may be greater than the minimum voltage input recognized as a high level input ($V_{IH}$) by the second circuit operating at 1.5 volts.

Further, some interface standards specify differing interface voltages. Typically, to comply with these differing interface voltages, a manufacturer creates differing integrated circuits to satisfy the differing interface voltages. For example, when the interface standard specifies a 3.3 volts operating mode, the manufacturer will use a 3.3 supply voltage part to satisfy the interface standard and would use a 1.5 volts supply voltage to satisfy a 1.2 volts interface voltage. Unfortunately, the benefits obtained by using a lower supply voltage core are not achieved when meeting the higher voltage interface standard.

Thus, there is a need in the art for a circuit design that permits circuits employing significantly different supply voltages to communicate with one another over a common interface.

BRIEF SUMMARY OF THE INVENTION

An integrated circuit constructed according to the present invention services an interface supporting at least two voltage domains and includes a core circuit and a buffer circuit. The core circuit operates at a core supply voltage. The buffer circuit operably couples to the core circuit and interfaces the core circuit to a set of input lines and a set of output lines. Each of the set of input lines and each of the set of output lines is controllable to support the at least two voltage domains. The buffer circuit includes a plurality of input buffers that are controllable to support the at least two voltage domains and a plurality of output buffers that are controllable to support the at least two voltage domains.

In one construction, each of the plurality of input buffers includes an input buffer rail circuit and an inverter. The input buffer rail circuit produces an input buffer rail voltage that is based upon a selected voltage domain of the at least two voltage domains. The inverter is powered by the input buffer rail voltage, receives an input signal corresponding to one of the at least two voltage domains, and produces an input signal to the core circuit that is consistent with the core supply voltage. Each of the plurality of input buffers may also include a pass gate that receives the input signal to limit the range of the input signal. Each of the plurality of input buffers may further include a pull-up circuit operably coupled between the input buffer rail voltage and a source voltage. The pull-up circuit is enacted when supporting one of the voltage domains to adjust a transition voltage of the inverter.

Each of the plurality of input buffers may also include a switch point shifting circuit that operably couples between an input of the inverter and an output of the inverter. The switch point shifting circuit is enacted when supporting one of the voltage domains to adjust a transition voltage of the inverter. The at least two voltage domains may includes a 1.2 volts voltage domain and a 3.3 volts voltage domain. In one particular construction, the core supply voltage is 1.2 volts.

The plurality of output buffers may each include a rail voltage supply and a plurality of transistors. A first control transistor has a source coupled to the rail supply voltage, a drain, and a gate that receives a first control input. A first breakdown prevention transistor has a source coupled to the drain of the first control transistor, a drain that serves as an output of the output buffer, and a gate that receives a first biasing input. A second breakdown prevention transistor has a drain coupled to the drain of the first breakdown prevention transistor, a source, and a gate that receives a second biasing input. A second control transistor has a drain coupled to the source of the second breakdown prevention transistor, a source coupled to a reference voltage, and a gate that receives a second control input. The output buffer may also include a control input generation circuit that receives an output signal from the core circuit and that produces the first control input and the second control input.

An embodiment of the method of the invention involves coupling one or more inputs of a first circuit to one or more outputs of a second circuit. The core of the first circuit operates at a first power supply voltage. The second circuit operates at either the first supply voltage of the first circuit or at a second power supply voltage that is greater than the first voltage. The method includes generating an internal supply voltage internal to the first circuit; the internal supply voltage being forced to the first power supply voltage if a first voltage mode is selected, and the internal supply voltage being forced to a third power supply voltage if a second voltage mode is selected, the third supply voltage having a magnitude that is in between the magnitude of the core supply voltage and the magnitude of the second supply voltage. The method further involves selecting the first supply mode if the second circuit is operating at the core supply voltage, and selecting the second supply mode if the second circuit is operating with the second supply voltage. The method also couples signals received from the outputs of the second circuit to the core of the first circuit through a buffer inverter coupled between VSS and the internal supply rail.

An embodiment of the method further includes adjusting the switch point of the buffer inverter to ensure that there is no overlap between a voltage specified as a low for the second circuit operating with the second supply voltage, and a voltage specified as a high for the core of the first circuit operating at the first supply voltage.

The third supply voltage generated internally is chosen so that it does not damage devises comprising the core of the first circuit. Selecting the first supply mode further includes forcing the first supply voltage onto a mode select pin. The method also includes selecting the second supply mode by forcing the second supply voltage onto the mode select pin, and voltage dividing the second supply voltage to obtain the internal supply voltage.

An embodiment of an output buffer circuit couples one or more outputs of a first circuit to one or more inputs of a second circuit. The core of the first circuit operates at a first power supply voltage, the second circuit operating at either the first supply voltage or a second power supply voltage that is greater than the first. An embodiment of the invention generates an internal supply voltage that is internal to the first circuit, the internal supply being forced to the first power supply voltage if a first voltage mode is selected. The internal supply voltage is forced to a third power supply voltage if a second voltage mode is selected, the third supply voltage having a magnitude that is in between the magnitude of the core supply voltage and the magnitude of the second supply voltage In one embodiment, the first supply mode is selected when the second circuit operating at the first supply voltage. The second supply mode is selected if the second circuit is operating with the second supply voltage. The method of the invention couples inputs of the second circuit to output signals generated by the core of the first circuit through an output buffer inverter coupled between VSS and the first supply voltage if the first voltage mode is selected, and to the second supply voltage if the second voltage mode is selected. When the second voltage mode is selected, the core output signals are converted from signals operating between about VSS and the first supply voltage to a first converted signal operating between about VSS and the third supply voltage. The gate of a pull-down device of the output buffer is then driven with the first converted signal.

When the second voltage mode is selected, the first converted signals are converted from a signal operating between about VSS and the third supply voltage to a second converted signal operating between a second VSS and the second supply voltage. The gate of a pull-up device of the output buffer is then driven with the second converted signal. The second VSS voltage is greater in magnitude than VSS by a voltage sufficient to ensure there is no breakdown of the pull-up device.

In an embodiment of the invention, the first supply voltage is about 1.2 volts, the second supply voltage is about 3.3 volts, the third supply voltage is about 2.5 volts, and the second VSS is about 0.8 volts.

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

DETAILED DESCRIPTION OF THE INVENTION

Figure 1:
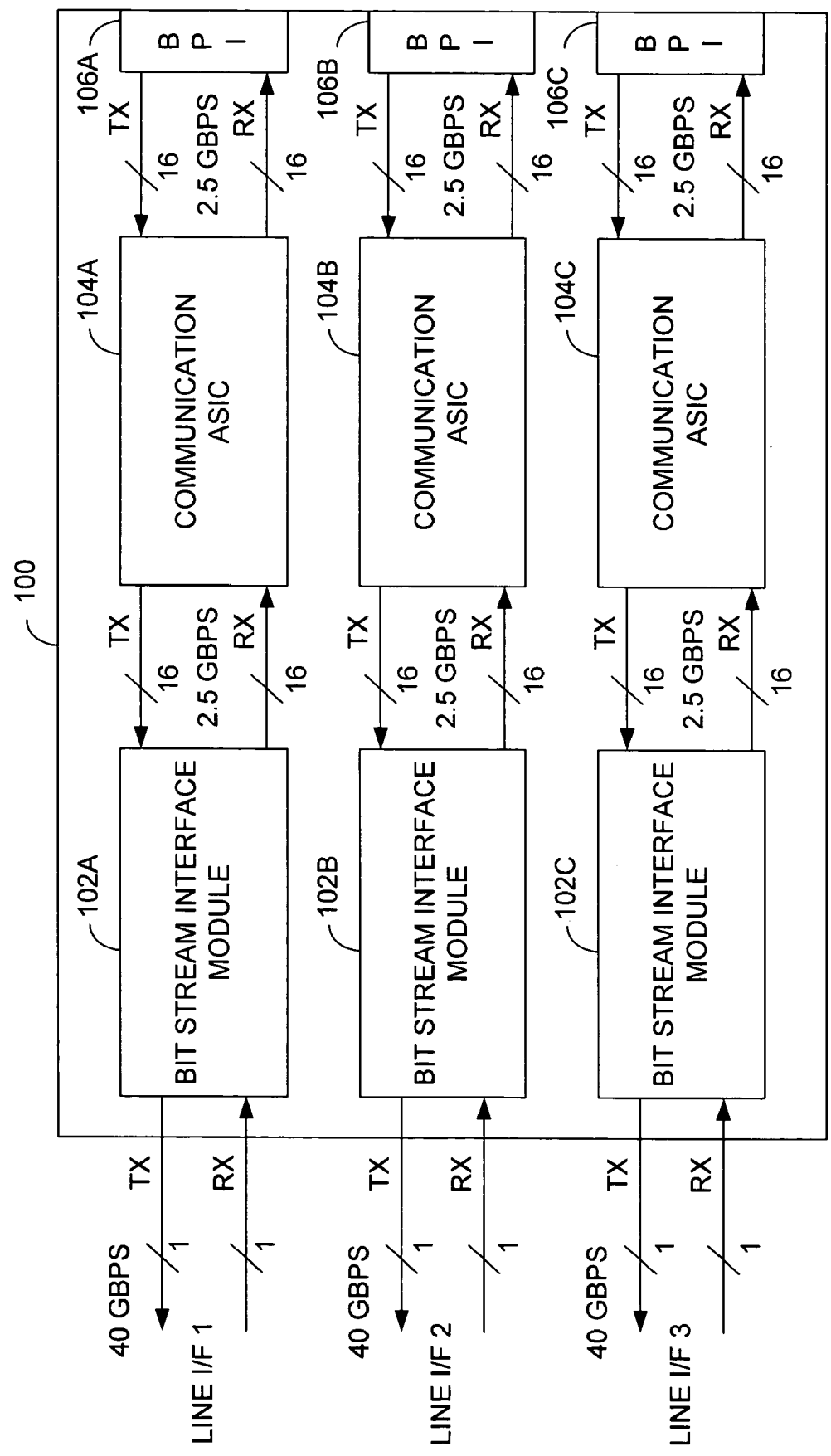
FIG. 1 is a block diagram illustrating a Printed Circuit Board (PCB) that has mounted thereon a plurality of Bit Stream Interface Module (BSIMs) constructed according to the present invention.

FIG. 1 is a block diagram illustrating a Printed Circuit Board (PCB) that has mounted thereon a plurality of Bit Stream Interface Module (BSIMs) integrated circuits constructed according to the present invention. As shown in FIG. 1, the PCB 100 includes BSIMs 102A, 102B and 102C. The PCB 100 also includes mounted thereon communication Application Specific Integrated Circuits (ASIC) 104A, 104B, and 104C. The PCB 100 is mounted within a housing that services switching requirements within a particular location or geographic area. Each of the BSIMs 102A, 102B, and 102C couples to a high-speed media such as an optical fiber via a respective media interface and supports the OC-768 or the SEC-768 standard at such media interface. On the second side of the BSIMs 102A through 102C, the SFI-5 interface standard is supported for communication between the BSIM 102A, 102B, and 102C and the ASICs chips 104A, 104B, and 104C. Communication ASICs 104A through 104C may communicate with other PCB components located in the housing via back interfaces 106A through 106C.

The BSIMs 102A through 102C may be removably mounted upon the PCB 100. In such case, if one of the BSIMs 102A through 102C fails it may be removed and replaced without disrupting operation of other devices on the PCB 100. When BSIMs 102A–102C are removably mounted upon the PCB 100, they are received by a socket or connection coupled to the PCB 100. Further, in such embodiment, the BSIMs 102A–102C may be constructed on a separate PCB.

Figure 2A:
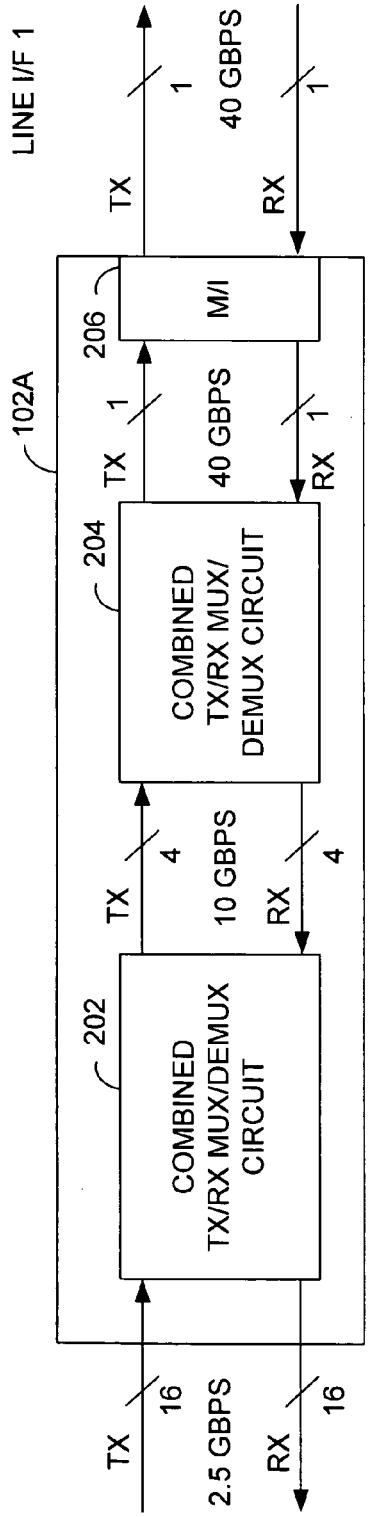
FIG. 2A is a block diagram illustrating one embodiment of a BSIM constructed according to the present invention.

FIG. 2A is a block diagram illustrating one embodiment of a BSIM 102A constructed according to the present invention. The BSIM 102A of FIG. 2A includes a first combined TX/RX multiplexer/demultiplexer circuit 202 and a second combined TX/RX multiplexer/demultiplexer circuit 204. On the line side of the BSIM 102A, the first combined TX/RX multiplexer/demultiplexer circuit 204 couples to a media, e.g., fiber optic cable or copper cable, via a media interface 206. The media interface 206 couples to the combined TX/RX multiplexer/demultiplexer circuit 204 via a 40 GPS nominal bit rate, one bit transmit and one bit receive interface. The TX and RX line medias themselves each support one bit 40 Giga bits-per-second (GBPS) nominal bit rate communications, such as is defined by the OC-768 and/or the SEC 768 specifications of the OIF.

The combined TX/RX multiplexer/demultiplexer circuit 202 interfaces with a communication ASIC, e.g. 104A, via 16 TX bit lines and 16 RX bit lines, each operating at a nominal bit rate of 2.5 GBPS. Such interface supports a nominal total throughput of 40 GBPS (16*2.5 GBPS). The interface between the combined TX/RX multiplexer/demultiplexer circuit 202 and the combined TX/RX multiplexer/demultiplexer circuit 204 includes 4 TX bit lines and 4 RX bit lines, each operating at a nominal rate of 10 GBPS. This interface supports a nominal total throughput of 40 GBPS (4*10 GBPS). This interface may operate substantially or fully in accordance with an operating standard known as the Q40 operating standard. However, the teachings of the present invention are not limited to according to operation of the Q40 standard nor is the description here intended to be a complete description of the Q40 standard itself.

Figure 2B:
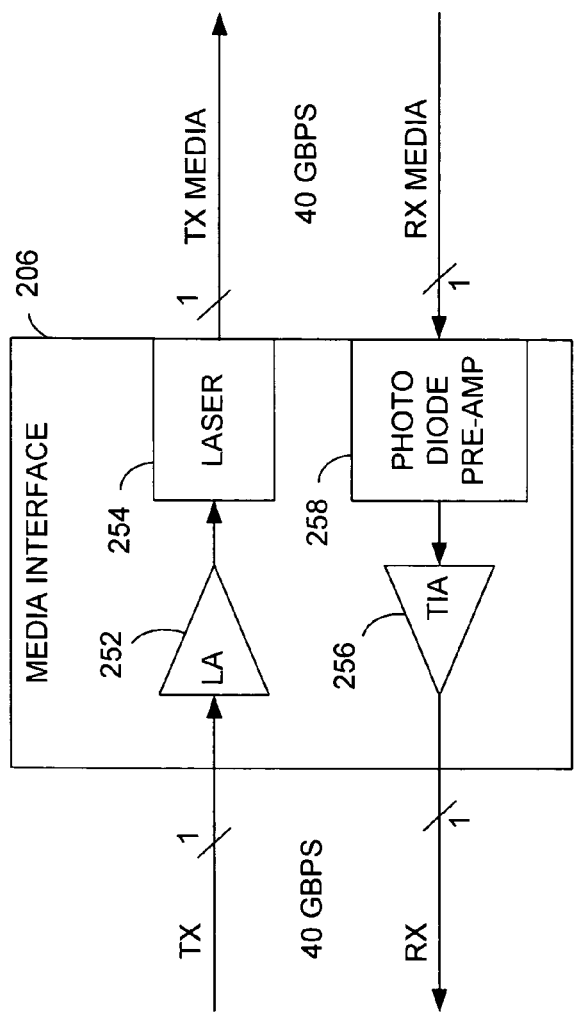
FIG. 2B is a block diagram illustrating an optical media interface that may be included with the BSIM of FIG. 2A

FIG. 2B is a block diagram illustrating an optical media interface that may be included with the BSIM 102A of FIG. 2A. As shown in FIG. 2B, the media interface 206 couples to an optical media on a first side and couples to the combined TX/RX multiplexer/demultiplexer circuit 204 on a second side. In the transmit path, the media interface 206 receives a single bit stream at a nominal bit rate of 40 GBPS from the combined TX/RX multiplexer/demultiplexer circuit 204. The TX bit stream is amplified by limiting amplifier 252 to produce a bit stream output that is coupled to laser 254. The laser produces an optical signal that is coupled to TX optical media.

On the receive side, an RX optical media produces the RX bit stream at a nominal bit rate of 40 GBPS. The RX bit stream is received by a photo diode/pre-amplifier combination 258. The photo diode/pre-amplifier combination 258 produces an output that is received by a transimpedance amplifier 256. The output of the transimpedance amplifier 256 is a single bit stream at a nominal bit rate of 40 GBPS that is provided to the combined TX/RX multiplexer/demultiplexer circuit 204 of FIG. 2A.

Figure 3:
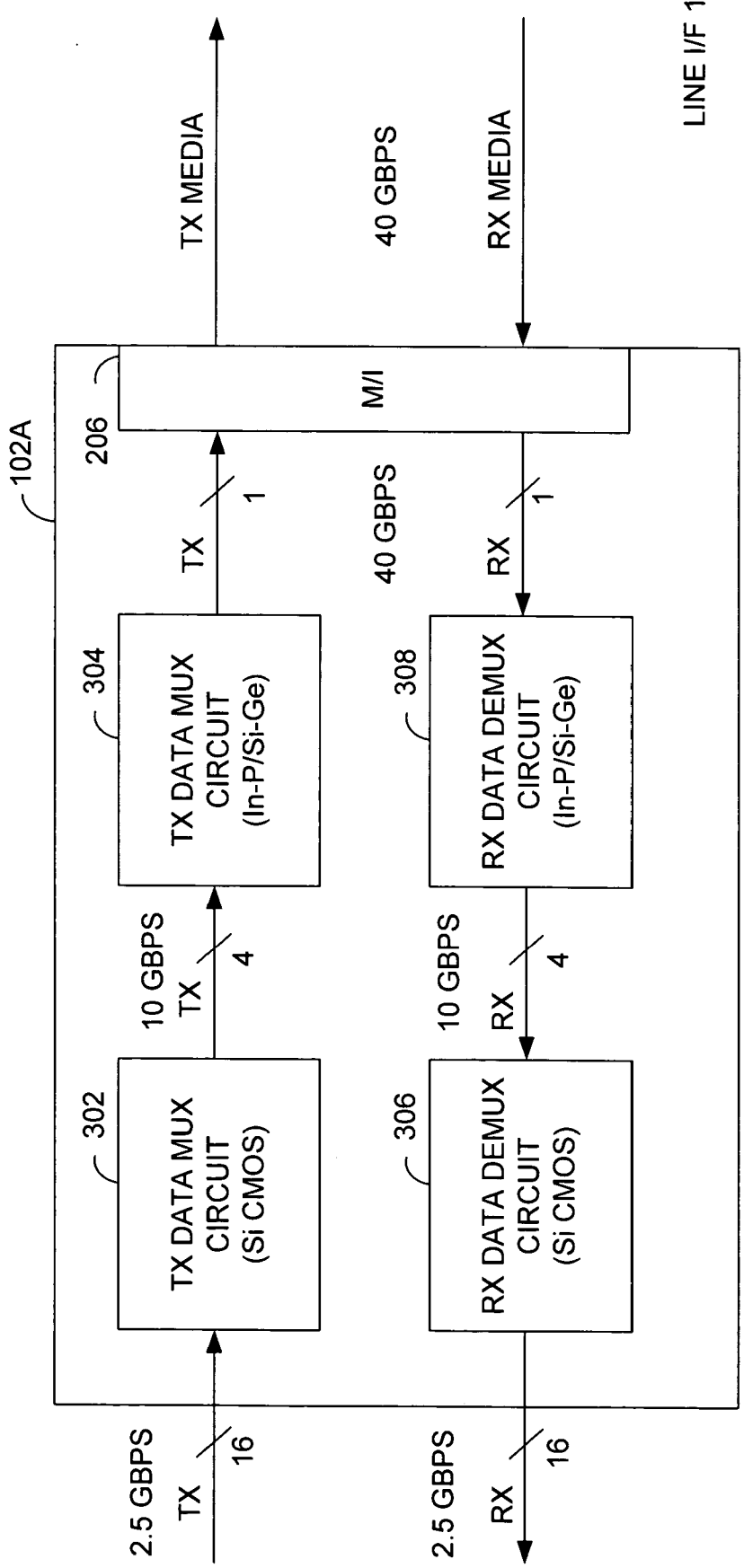
FIG. 3 is a block diagram illustrating another embodiment of a BSIM constructed according to the present invention.

FIG. 3 is a block diagram illustrating another embodiment of a BSIM constructed according to the present invention. The embodiment of FIG. 3 differs from the embodiment of FIG. 2A in that separate TX and RX circuit components are employed. While the media interface 206 of FIG. 3 is shown to be a single device such as shown in FIG. 2A, in other embodiments, the media interface 206 may be formed in separate circuits corresponding to the separate TX and RX paths shown in FIG. 2B.

In the TX path, TX data multiplexer circuit 302 receives a 16 bit wide by 2.5 GBPS nominal bit rate input from a coupled ASIC and produces a 4 bit wide×10 GBPS nominal bit rate TX output. In the embodiment described herein, the TX data multiplexer circuit 302 is constructed in a Silicon CMOS process, for example in a 0.13 micron CMOS process. The TX data multiplexer circuit 302 multiplexes the 16 bit wide by 2.5 GBPS nominal bit rate input to produce a 4 bit wide 10 GBPS nominal bit rate output, which is received by the TX data multiplexer circuit 304. The TX data multiplexer circuit 304 multiplexes the 4 bit wide×10 GBPS nominal bit rate output to produce a single bit wide output at a nominal bit rate of 40 GBPS.

The TX data multiplexer circuit 304 must switch at a frequency that is at least four times the rate at which the TX data multiplexer circuit 302 must switch. For this reason, the TX data multiplexer circuit 304 is constructed in an Indium-Phosphate process or in a Silicon-Germanium process. Each of these processes supports the higher switching rates required at the 40 GBPS output of the TX data multiplexer circuit 304. Thus in combination the TX data multiplexer circuit 302 constructed in a CMOS process and the TX data multiplexer circuit 304 constructed in an Indium-Phosphate or Silicon-Germanium process will provide a high performance relatively low cost solution to the interfacing of a 2.5 GBPS nominal bit rate 16 bit wide interface and a 40 GBPS 1 bit wide interface.

Likewise, in the RX path, the bit stream interface module 102A includes an RX data demultiplexer circuit 308 that receives a single bit stream at a nominal bit rate of 40 GBPS data. The RX data demultiplexer circuit 308 produces a 4 bit wide×10 GBPS nominal bit rate output. The RX data demultiplexer circuit 306 receives the 4 bit wide×10 GBPS nominal bit rate output and produces a 16 bit wide×2.5 GBPS nominal bit rate receive data stream.

As was the case with the TX data multiplexer circuit 302 and the TX data multiplexer circuit 304, the RX data demultiplexer circuit 306 and the RX data demultiplexer circuit 308 are formed in differing process types. In particular the RX data demultiplexer circuit 306 is constructed in a Silicon CMOS process. Further, the RX data demultiplexer circuit 308 is constructed in an Indium-Phosphate or Silicon-Germanium process so that the RX demultiplexer circuit 308 will support the higher switching speeds of the 1 bit wide×40 GBPS interface to the media interface 206.

The combined TX/RX multiplexer/demultiplexer circuit 202, FIG. 2A, the TX data multiplexer circuit 302 and the RX data demultiplexer circuit 306 interfaces with the communication ASIC 104A–C using a standard interface, e.g., SPI-5 embodiment. Further, the RX data demultiplexer circuit 306, the TX data multiplexer circuit 302, and the TX/RX multiplexer circuit 202 interface with the RX data demultiplexer circuit 308, the TX data multiplexer circuit 304, and the combined TX/RX data multiplexer/demultiplexer circuit 204, respectively, according to a standardized interface, e.g., Q40 interface. Thus, these circuits must comply with the signal levels of the corresponding interface standards.

Thus, according to the present invention, each of the combined TX/RX multiplexer/demultiplexer circuit 202, the TX data multiplexer circuit 302, and the RX data demultiplexer circuit 306 support differing interface voltages at their interface pads. In one particular embodiment, these circuits support both a 1.2 volts mode of operation and a 3.3 volts mode of operation on the same set of interface pads. Thus, even though the integrated circuits operate using a single supply voltage, the integrated circuits include inputs and outputs that support differing interface standard voltage modes of operation. In one particular embodiment of the present invention, each of these circuits operates using a power supply voltage of 1.2 volts, which is significantly lower than the legacy supply voltage of 3.3 volts, but still meets both the 1.2 volts and the 3.3 volts interface standard voltage modes of operation.

In one embodiment these circuits support a 1.2 volts bit stream interface specification in which (1) an input is binary high when between 0.78 volts and 1.5 volts, while a binary low is between –0.3 volts and 0.42 volts; and (2) an output that is binary high must be produced that is between 0.9 volts and 1.3 volts, while an output that is binary lost must be produced that is between –0.1 volts and 0.3 volts. Likewise, these circuits support a 3.3 volts bit stream interface specification in which (1) an input is binary high when between 2.0 volts and 3.3 volts, while a binary low is between –0.3 volts and 0.42 volts; and (2) an output that is binary high must be produced that is between 2.4 volts and 3.4 volts, while an output that is binary lost must be produced that is between 0.0 volts and 0.4 volts. As is apparent, these interface specifications have overlapping voltage requirements. Thus, the circuits of the present invention include buffer circuits that support these two bit stream interface specifications.

Figure 4:
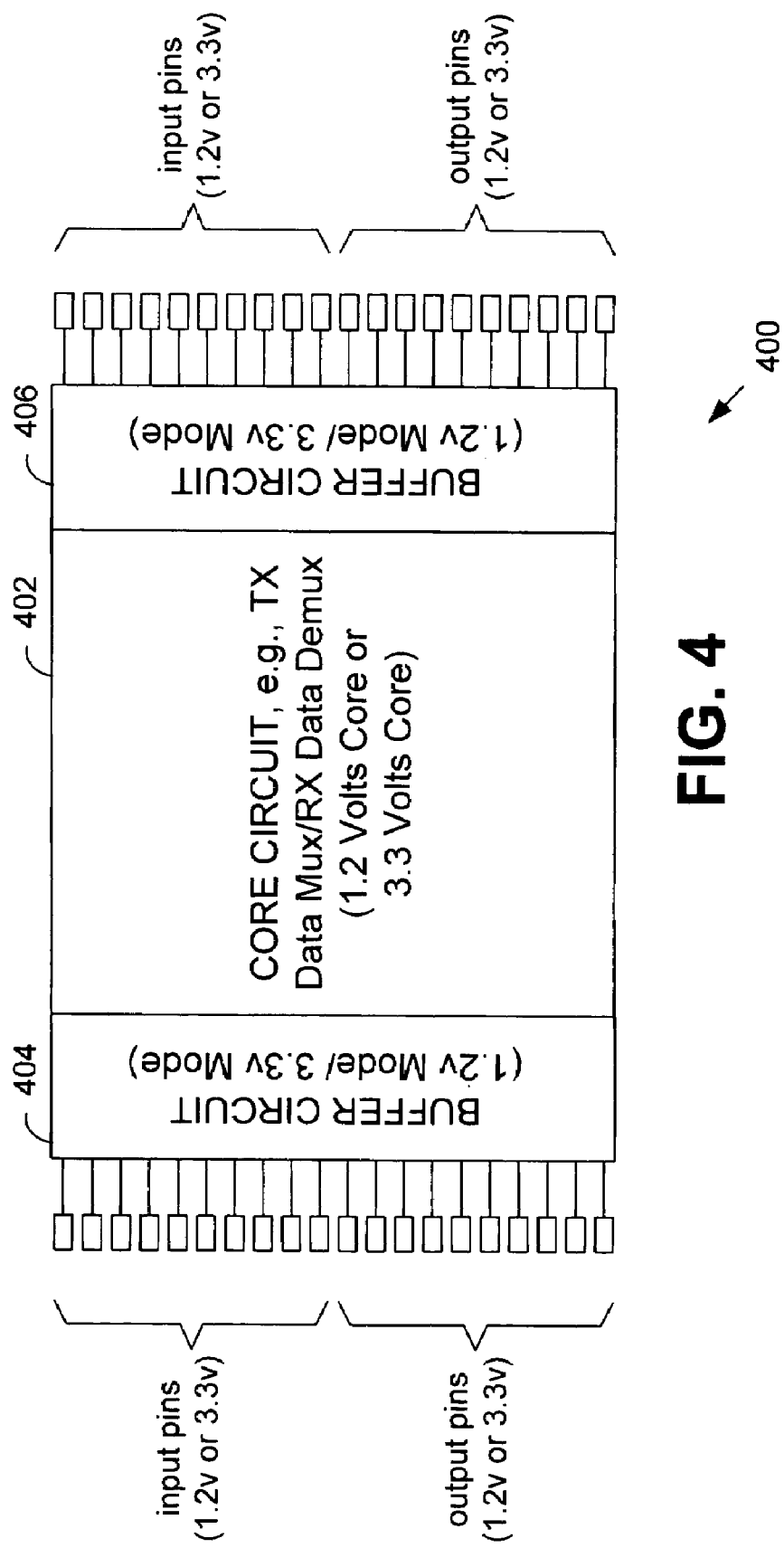
FIG. 4 is a block diagram illustrating an integrated circuit constructed according to the present invention.

FIG. 4 is a block diagram illustrating an integrated circuit 400 constructed according to the present invention. The integrated circuit 400 includes a core circuit 402 and at least one of buffer circuit 404 and/or buffer circuit 402. The integrated circuit may be any of the RX data demultiplexer circuit 306, the TX data multiplexer circuit 302, the TX/RX multiplexer circuit 202, or another integrated circuits that is required to support multiple interface voltage standards at its pads. A core supply voltage powers the core circuit 402. In the embodiments described further herein, 1.2 volts is the core supply voltage. However, in other embodiments, the core supply voltage may be 3.3 volts or another voltage. As is known, it is advantageous to use a lower supply voltage for the core circuit 402 to reduce power consumption and heat generation.

Each of the buffer circuits 404 and 406 are employed to serve as a buffer between the core circuit 402 and a wired interface. According to the present invention, the buffer circuits 404 and 406 service at least two differing interface standard voltages, e.g., 1.2 volts or 3.3 volts, using a single set of pads. Thus, while the 1.2 volts interface standard would be consistent with a 1.2 volts core supply voltage, the buffer circuits 404 and 406 provide the flexibility of supporting differing voltage domains, e.g., 3.3 volts, via a single set of pads.

The buffer circuits 404 and 406 of FIG. 4 include both input buffers and output buffers. The input buffers serve to receive incoming signals on input pads of the single set of pads, convert the incoming signals to a level that is consistent with the core circuit 402, and to provide the incoming signals to the core circuit. Likewise, the output buffers serve to receive output signals from the core circuit 402, to convert the output signals at level consistent with the core circuit 402 to a level consistent with the interface standard voltage mode of the output interface(s), and to produce the outgoing signals on output pads of the single set of pads.

As should be apparent to the reader, the buffer circuits 404 and 406 may each service a differing voltage level that corresponds to the interface standard they support. For example, buffer circuit 404 may support a 1.2 volts interface standard while buffer circuit 406 supports a 3.3 volts interface standard, or vice versa. In another operation, buffer circuits 402 and 404 may each support a 3.3 volts interface standard while the core circuit 402 operates using a 1.2 volts power supply level. These various voltage levels will be described hereinafter as "voltage domains." In particular, a buffer circuit 404 or 406 that supports both a 1.2 volts mode and a 3.3 volts mode on a single set of pads is said to be switchable between voltage domains, i.e., 1.2 volts domain and 3.3 volts domain.

Figure 5A:
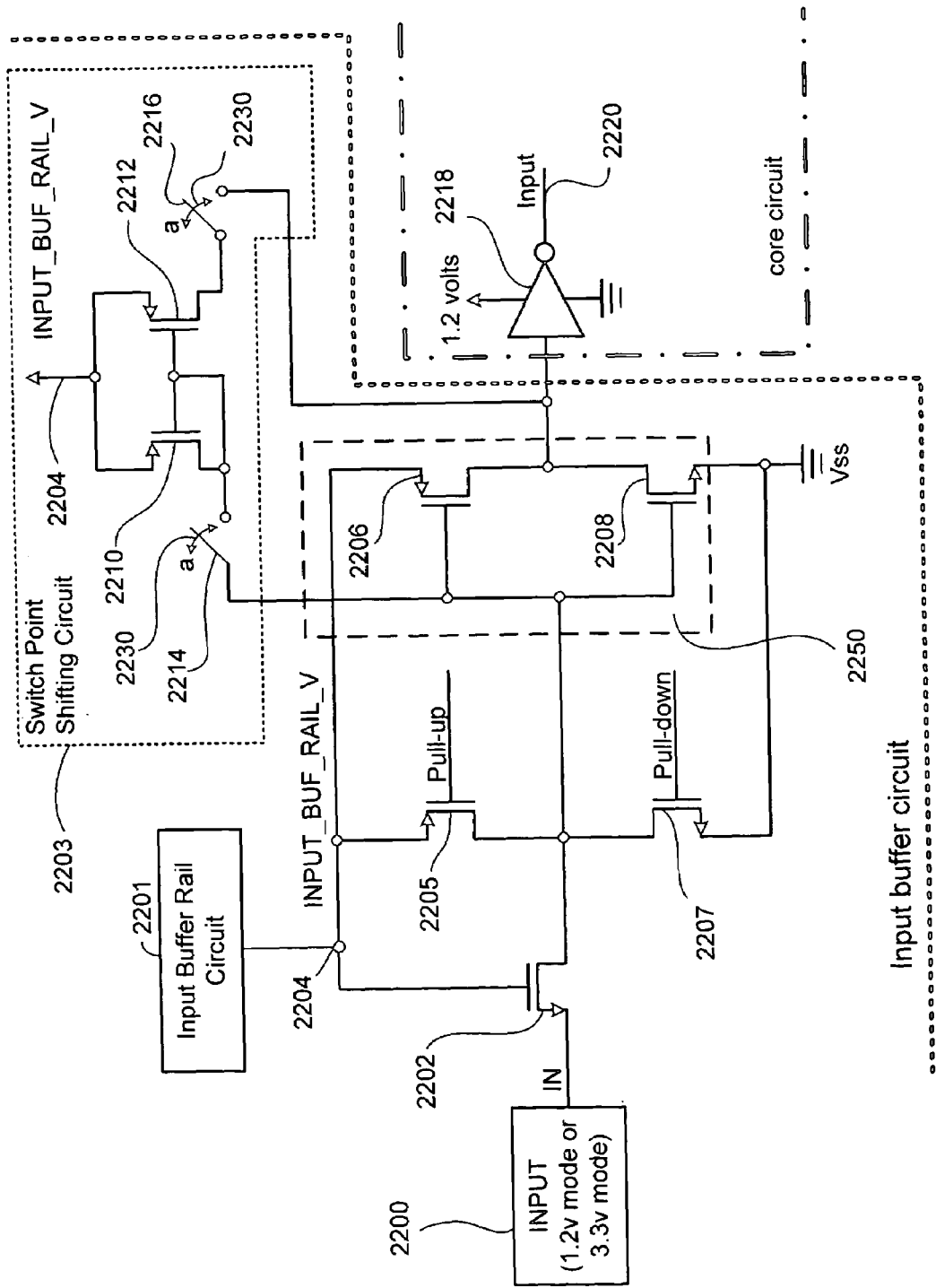
FIG. 5A illustrates one embodiment of an input buffer that supports a switchable voltage domain in accordance with the present invention.

FIG. 5A illustrates one embodiment of an input buffer that supports a switchable voltage domain in accordance with the present invention. The input buffer would reside within the buffer circuit 404 or 406 of FIG. 4, for example the combined TX/RX multiplexer/demultiplexer circuit (202, FIG. 2A) or the separate TX data multiplexer circuits 302 and 306 of FIG. 3 (these circuits referred to generically as the integrated circuit 400 of FIG. 4. The input buffer of FIG. 5A permits the core circuit 402 to successfully receive signals transmitted according to either a 1.2 volts interface standard or a 3.3 volts interface standard. A unique copy of the input buffer of FIG. 5A would be included for each input pad/pin/input of the buffer circuit 404 or 406 of FIG. 4 that supports multiple voltage domains. As will be described with reference to FIG. 7 and FIG. 8 the buffer circuit 404 or 406 will also include an output buffer for each pad/pin/output that supports multiple voltage domains.

The input buffer of FIG. 5A includes a pass gate 2202, a pull-up/pull-down circuit, an inverter 2250, an input buffer rail circuit 2201, and a switch point shifting circuit 2203. The input buffer rail circuit produces an input buffer rail voltage (INPUT_BUF_RAIL_V) 2204 and is described further with reference to FIG. 5B. The pass gate 2202 is employed as a depletion mode FET to keep the other transistors of the input buffer from breaking down. Specifically, if a voltage significantly greater than INPUT_BUF_RAIL_V 2204 is received at the INPUT, the depletion-mode FET shuts off, protecting the inverter 2250 of the input buffer. The pull-up/pull-down circuit includes a pull-up transistor 2205 and a pull-down transistor 2207 that are operated in either a pull-up mode or in a pull-down mode, depending upon the particular operation. The inverter 2250 includes transistors 2206 and 2208 and is coupled between INPUT_BUF_RAIL_V 2204 and VSS. The output of the inverter 2250 serves as an input to the core circuit 402. The core circuit 402 inverts the input via inverter 2218 to produce an input signal 2220.

Figure 5B:
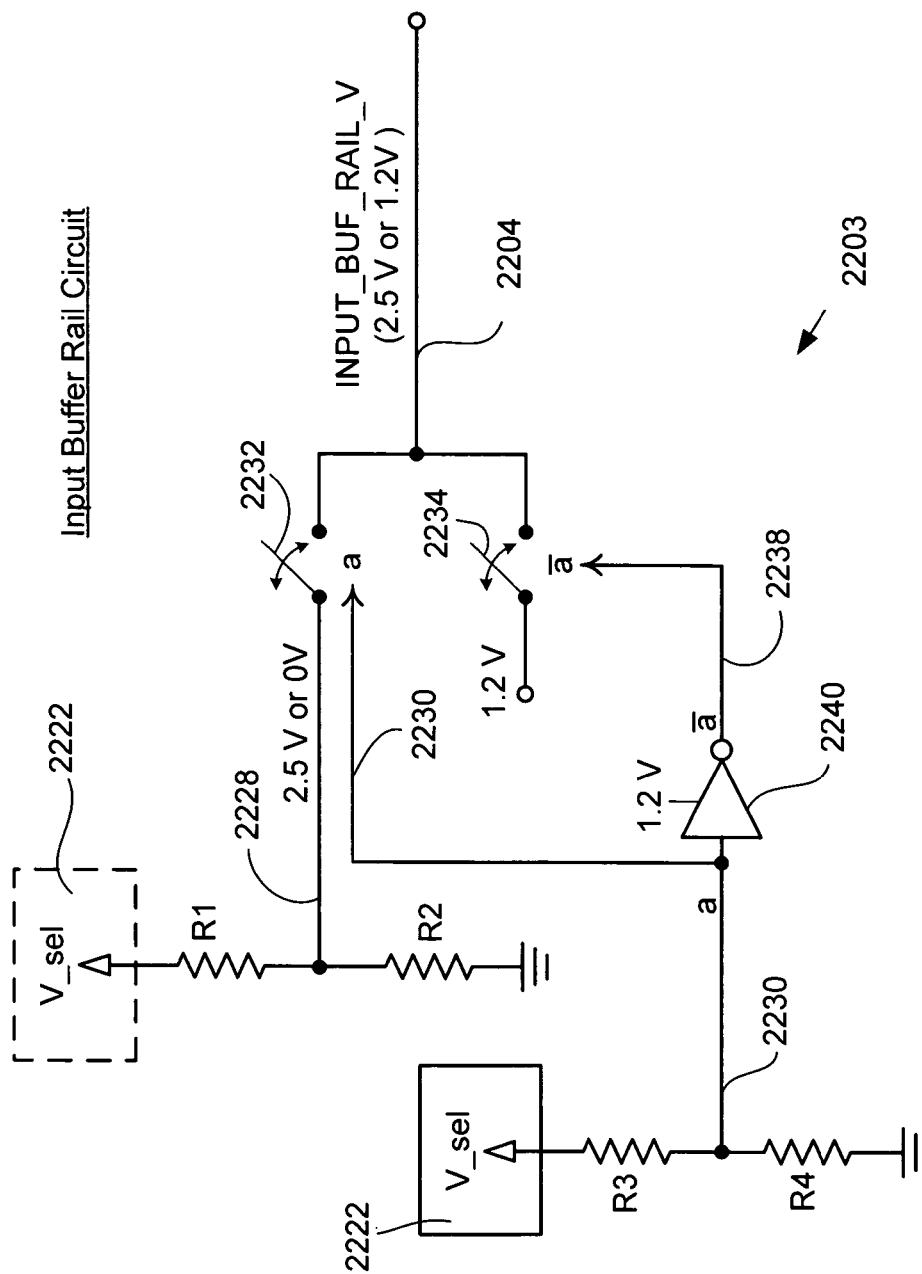
FIG. 5B is a circuit diagram illustrating the input buffer rail circuit of the present invention of FIG. 5A.

FIG. 5B is a circuit diagram illustrating the input buffer rail circuit of the present invention of FIG. 5A. Referring to both FIG. 5A and FIG. 5B, when the input buffer operates to support a 3.3 volts interface standard, 3.3 volts is applied to first circuit input pin V_SEL 2222. The voltage divider formed by resistors R1 and R2 produces a voltage substantially equal to 2.5 volts at node 2228 (as does the voltage divider formed by resistors R3 and R4 at node 2230). The signals produced at nodes 2230 and 2238 control switches 2232 and 2234 respectively such that 2.5 volts is produced at INPUT_BUF_RAIL_V 2204 when V_SEL is set to 3.3 volts. When the input buffer is operated to support a 1.2 volts interface standard, 0 volts is applied to V_SEL 2222 causing switch 2234 to close and switch 2232 to open, thus forcing INPUT_BUF_RAIL_V 2204 equal to a core supply voltage of 1.2 volts. Switches 2232 and 2234 (as well as switches 2230 and 2216 of FIG. 5A) are formed of suitable transistors.

With the 1.2 volts domain selected and INPUT_BUF_RAIL_V 2204 forced to 1.2 volts, the switch point of the INPUT signal 2200 is approximately 0.6 volts (i.e. halfway between the extremes of the 1.2 V core power supply swing). Thus, in the 1.2 volts domain, inverter 2250 effectively operates at the same power supply voltage level as the core inverter 2218. In the 1.2 volts domain, the buffer circuit is able to receive signals over a SFI-5 interface in accordance with the input levels as specified for the 1.2 volts domain (i.e. maximum of 0.42 volts for binary zero and a minimum of 0.78 volts for binary high).

If the V_SEL pin 2222 is set at 3.3 volts, thereby selecting the 3.3 volts domain, INPUT_BUF_RAIL_V 2204 is forced to 2.5 volts. However, the pull-up 2205 and pull-down 2207 devices and the switch point shifting circuit 2203 are operated to shift the switch point to be higher than the halfway point between 0 volts and 2.5 volts, i.e., 1.3 volts to 1.4 volts. In particular, the switch point of the input signal 2200 is shifted higher using the pull-up 2205 and pull-down 2207 devices. Further, switches 2214 and 2216 of the switch point shifting circuit 2203 are closed by the control signal a 2230. This connects additional P-channel FETs 2210 and 2212 of the switch point shifting circuit 2203 into the buffer circuit to help shift the switch point even higher. Doing so ensures that the inverter 2218, which operates with the 1.2 volts core supply, does not switch to a logical high until the INPUT 2200 well exceeds 0.8 volts, which is the maximum for a binary low in the 3.3 volts domain.

Figure 6:
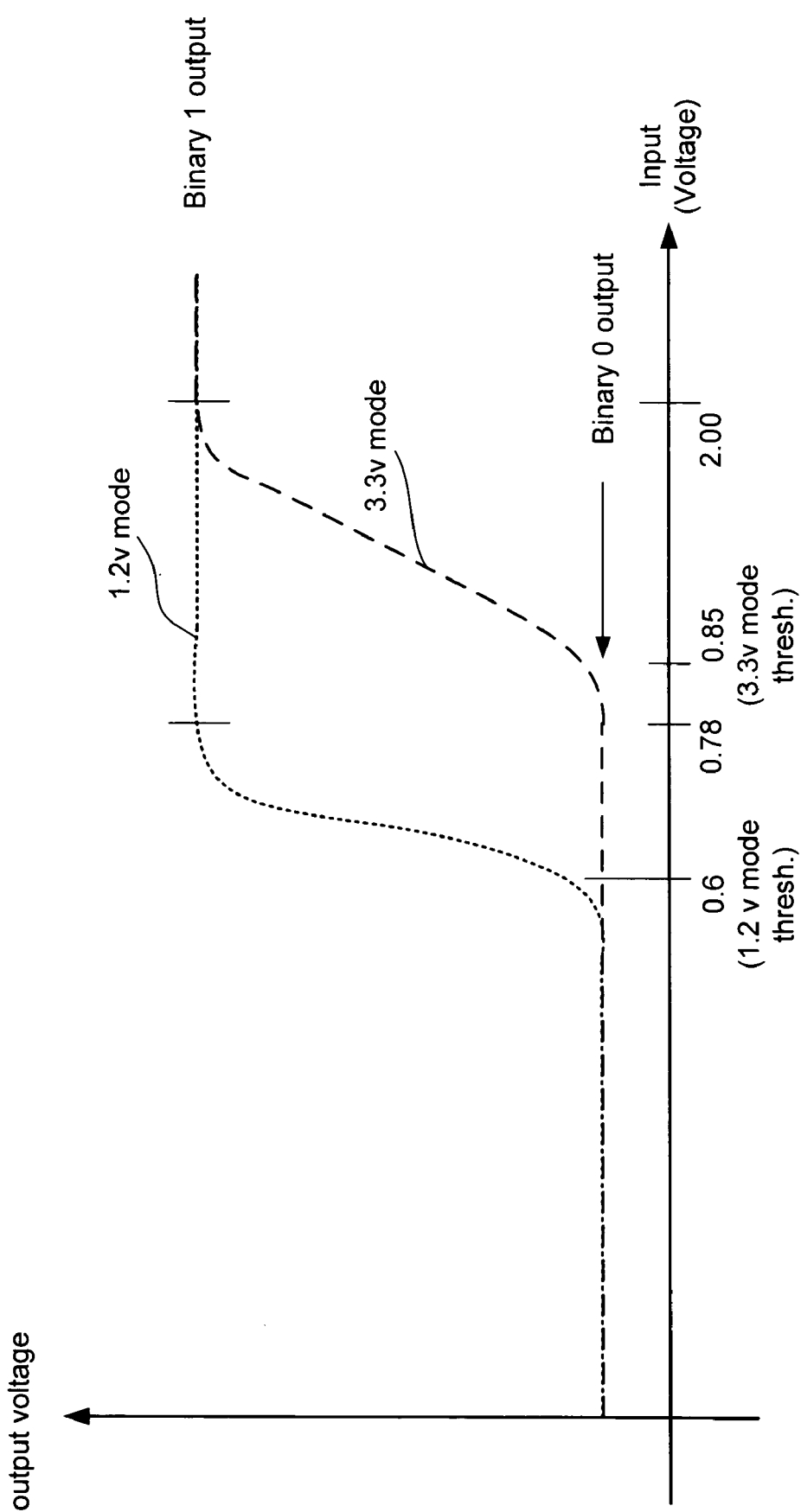
FIG. 6 is a graph that illustrates the switching points for the 1.2 volts and 3.3 volts voltage domains supported according to the present invention.

FIG. 6 is a graph that illustrates the switching points for the 1.2 volts and 3.3 volts voltage domains supported according to the present invention. The reader will recognize that this graph is for illustration purposes only, and is not intended to represent precise switch points for the input buffer embodiment of FIGS. 5A and 5B. The reader will also recognize that while the techniques described above been applied to the specific voltage domains of 1.2 volts and 3.3 volts, the buffer circuit having switchable domains of the invention can be applied to other combinations of voltages without departing from the spirit or intended scope of the invention. The particular switching requirements met by the input buffer of the present invention are summarized in Table 1.

TABLE 1

Switching Voltages for 1.2 volts mode and 3.3 volts voltage domains

| Parameter | Voltage Domain | Min | Max |
|---|---|---|---|
| Input Low | 3.3 Volts | 0 Volts | 0.8 Volts |
| Input Low | 1.2 Volts | −0.3 Volts | 0.42 Volts |
| Input High | 3.3 Volts | 2.0 Volts | 3.3 Volts |
| Input High | 1.2 Volts | 0.78 Volts | 1.5 Volts |

Figure 7:
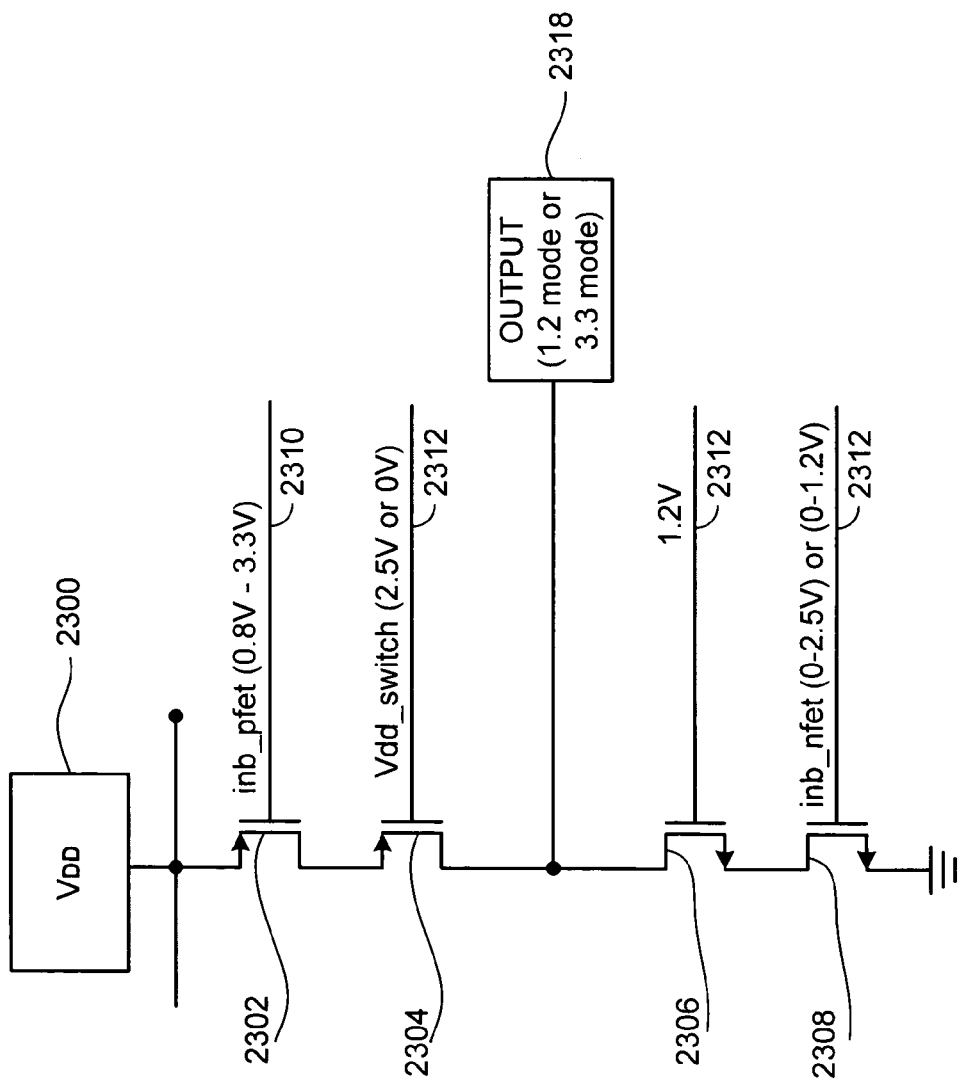
FIG. 7 is a circuit diagram illustrating an output buffer constructed according to the present invention that supports a switchable voltage domain.
Figure 8:
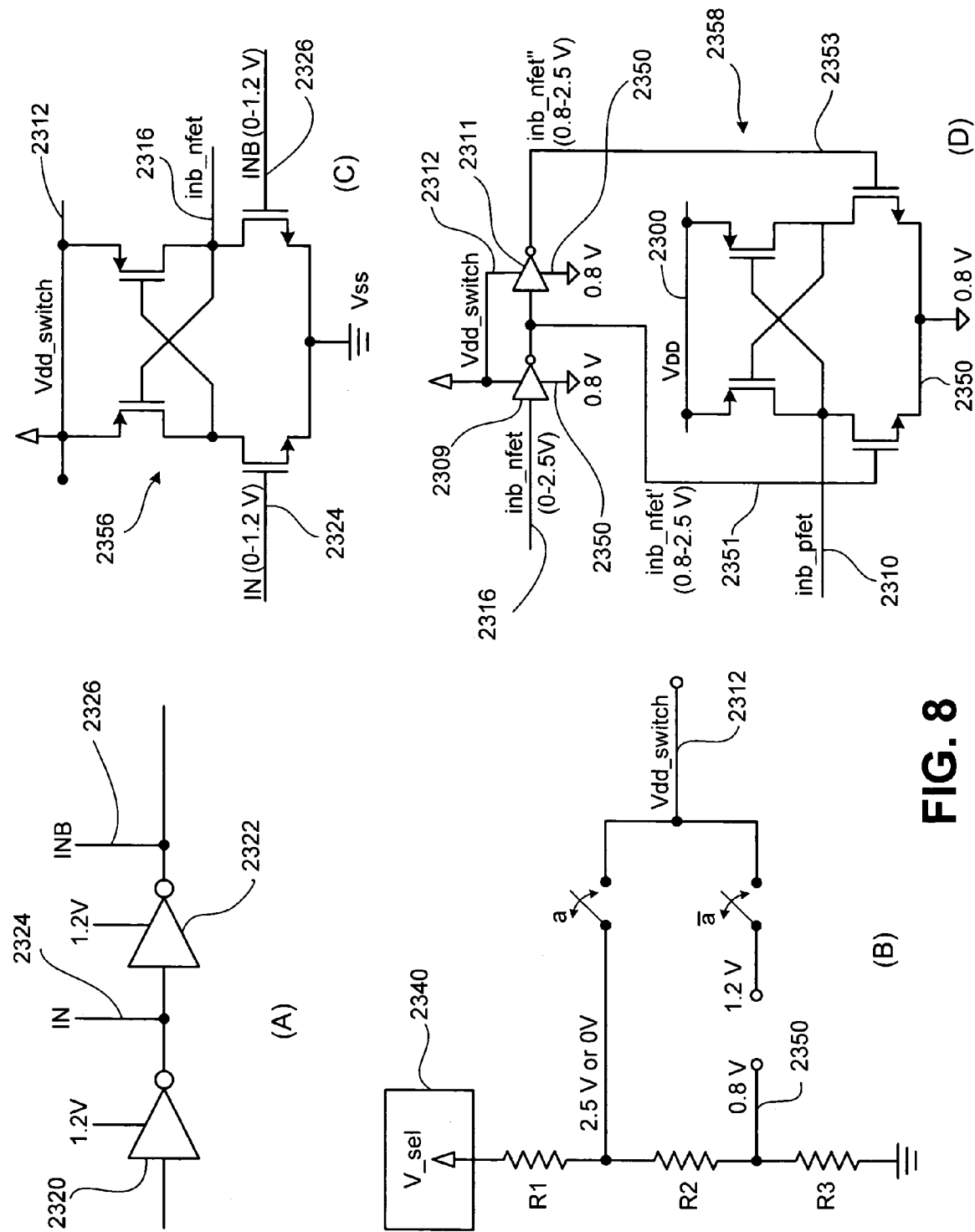
FIGS. 8(A)–(D) are circuit diagrams illustrating one embodiment of circuits for generating control signals internal to the output buffer of FIG. 7.

FIG. 7 is a circuit diagram illustrating an output buffer constructed according to the present invention that supports a switchable voltage domain. The output buffer receives an input from the core circuit 402 at the supply voltage of the core circuit 402 and produces an output signal according to the selected voltage domain, e.g., 1.2 volts or 3.3 volts. Supply voltages corresponding to the supported voltage domains power the output buffer, i.e. 3.3 V and 1.2 V. P-channel FET 2304 and N-channel FET 2306 are always on and are designed to prevent breakdown of the other transistors when the output buffer is operating in the 3.3 volts domain. The gate of P-channel FET 2304 is coupled to an internally generated power rail VDD_Switch 2312, which is 2.5 volts when operating in the 3.3 volts domain and is 0 volts when operating in the 1.2 volts domain.

The output buffer includes control P-channel FET 2302 and N-channel FET 2308, the gates of which are coupled to receive signals from the core circuit 402. The P-channel FET 2302 receives the signal inb_pfet 2310 while the N-channel FET 2308 receives the signal inb_nfet 2316. When the core circuit 402 operates at a supply voltage of 1.2 volts, the input signals swing from 0 to 1.2 volts. When the core circuit 402 operates at a supply voltage of 3.3 volts, the input signals swing from 0.8 to 3.3 volts for the input of P-channel FET 2302 and 0 to 2.5 volts for the N-channel FET 2308. The output of the output buffer is coupled to an output pin 2318, which in turn is coupled to another circuit via a standardized interface.

FIGS. 8(A)–(D) are circuit diagrams illustrating one embodiment of circuits for generating control signals internal to the output buffer of FIG. 7. FIG. 8(A) illustrates an interface between an output originating from the core circuit 402. The output signal is provided to an inverter 2320 that operates at a supply voltage of 1.2 volts. The output of inverter 2320 produces signal IN 2324 and signal INB 2326 via inverter 2322, also operating at the supply voltage of 1.2 volts.

FIG. 8(B) illustrates a circuit that generates 2.5 volts or 0.8 volts based upon the resistor divider made up of resistors R1, R2, and R3. As in the case of the input buffer described previously, a mode select pin V_SEL 2340 is set to choose the domain in which the first circuit is to operate. Internally generated power supply rail VDD_Switch 2312 is generated as 2.5 volts when V_SEL 2340 is forced to 3.3 volts and is 1.2 volts when V_SEL is forced to 0 volts. The switches are controlled by signal a and a-bar such that for the 3.3 volts domain, the switch controlled by signal a is closed, and the switch controlled by signal a-bar is closed when the 1.2 volts domain is selected.

When V_SEL 2340 is at 3.3 volts, the input signals IN 2324 and INB 2326 must be converted to signals that can be handled by the driving FETS 2302 and 2308 without breakdown, and which provide proper operation of the inverter structure of the output buffer. The cross-coupled inverter circuit 2356 of FIG. 8(C) converts IN 2324 from a 0 to 1.2 volts signal (the core voltage swing) to 0 to 2.5 volts signals inb_nfet 2316. The inb_nfet 2316 is used to drive the gate of N-channel FET 2308 of FIG. 7.

In turn, inb_nfet 2316 is itself converted from a 0 to 2.5 volts signal (from the circuit of FIG. 8(C)) to a 0.8 to 3.3 volts signal using the circuit of FIG. 8(D). First, inverters 2309 and 2311 generate signals inb_nfet' 2351 and inb_nfet" 2353, which are 0.8 to 2.5 volts signals. This is accomplished because the VSS rails of the inverters are coupled to a 0.8 volts signal 2350. These two signals inb_nfet" 2351 and inb_nfet" 2353 are then input to the cross-coupled inverter 2358, which produces an output that pulls up to power supply voltage VDD 2300, which is also the supply voltage to which the output buffer pulls up. Assuming that the output buffer supports an interface voltage standard of 3.3 volts, then as previously disclosed, this voltage is forced onto circuit pin 2300 of the first circuit. Thus, the output inb_pfet 2310 from cross-coupled inverter 2358 is a signal logically corresponding to IN 2324 but which now operates from 0.8 to 3.3 volts and is used to drive the gate of P-channel FET 2302, FIG. 7.

From the foregoing, it is apparent that the signal inb_nfet 2316 operates between 0 and 2.5 volts because 0 volts will shut off the N-channel FET 2308 and 2.5 volts will turn it on. The signal inb_pfet 2310 must be converted to operate between 0.8 volts and 3.3 volts because a 0 volts input on the gate of the P-channel FET 2302 of FIG. 7 would cause it to breakdown. The cross-coupled inverters 2356 of FIG. 8(C) and 2358 of FIG. 8(D) are used to perform the step up of the upper voltage of the voltage swing because their cross-coupled P-channel FETs do not have to operate using the lower input voltages against the increased VDD values, which would make them difficult to shut off.

If the voltage domain that is chosen as 1.2 volts, VDD will be forced to 1.2 volts and the buffer structure of FIG. 7 will operate between 0 and 1.2 volts. V_Sel 2340 will be forced to 0 volts, which means that the internal supply rail for the output buffer circuit will be at 1.2 volts. The cross-coupled inverter 2356 has no affect on the voltage swing of the driving signals because it is operating between 0 and 1.2 volts. Cross-coupled inverter 2358 can have no affect if the 0.8 volts signal coupled to the VSS of the inverter is switched out for ground.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is intended to cover all modifications, equivalents and alternatives falling within the spirit and scope of the present invention as defined by the claims.

The invention claimed is:

1. An integrated circuit that services an interface supporting at least two voltage domains, the integrated circuit comprising:

a core circuit that operates at a core supply voltage; and a buffer circuit operably coupled to the core circuit that interfaces the core circuit to a set of input lines and a set of output lines, wherein each of the set of input lines and each of the set of output lines is controllable to support the at least two voltage domains, wherein the buffer circuit includes:

a plurality of input buffers that are controllable to support the at least two voltage domains, each of the plurality of input buffers includes:

an input buffer rail circuit that produces an input buffer rail voltage that is based upon a selected voltage domain of the at least two voltage domains; and an inverter powered by the input buffer rail voltage that receives an input signal corresponding to one of the at least two voltage domains and that produces an input signal to the core circuit that is consistent with the core supply voltage; and a plurality of output buffers that are controllable to support the at least two voltage domains.

2. The integrated circuit of claim 1, wherein each of the plurality of input buffers further comprises a pass gate that receives the input signal to limit the range of the input signal.

3. The integrated circuit of claim 1, wherein each of the plurality of input buffers further comprise a pull-up circuit operably coupled between the input buffer rail voltage and a source voltage, wherein the pull-up circuit is enacted when supporting one of the voltage domains to adjust a transition voltage of the inverter.

4. The integrated circuit of claim 1, wherein each of the plurality of input buffers further comprise a switch point shifting circuit operably coupled between an input of the inverter and an output of the inverter, wherein the switch point shifting circuit is enacted when supporting one of the voltage domains to adjust a transition voltage of the inverter.

5. The integrated circuit of claim 1, wherein the at least two voltage domains includes a 1.2 volts voltage domain and a 3.3 volts voltage domain.

6. The integrated circuit of claim 5, wherein the core supply voltage is 1.2 volts.

7. The integrated circuit of claim 1, wherein each of the plurality of output buffers comprises:

a rail voltage supply;

a first control transistor having a source coupled to the rail supply voltage, a drain, and a gate that receives a first control input;

a first breakdown prevention transistor having a source coupled to the drain of the first control transistor, a drain that serves as an output of the output buffer, and a gate that receives a first biasing input;

a second breakdown prevention transistor having a drain coupled to the drain of the first breakdown prevention transistor, a source, and a gate that receives a second biasing input; and a second control transistor having a drain coupled to the source of the second breakdown prevention transistor, a source coupled to a reference voltage, and a gate that receives a second control input.

8. The integrated circuit of claim 7, further comprising a control input generation circuit that receives an output signal from the core circuit and that produces the first control input and the second control input.

9. An integrated circuit that services an interface supporting at least two voltage domains, the integrated circuit comprising:

a core circuit that operates at a core supply voltage; and a buffer circuit operably coupled to the core circuit that interfaces the core circuit to a set of input lines and a set of output lines, wherein each of the set of input lines and each of the set of output lines is controllable to support the at least two voltage domains, wherein the buffer circuit includes:

a plurality of input buffers that are controllable to support the at least two voltage domains; and a plurality of output buffers that are controllable to support the at least two voltage domains, each of the plurality of output buffers includes:

a rail voltage supply;

a first control transistor having a source coupled to the rail supply voltage, a drain, and a gate that receives a first control input;

a first breakdown prevention transistor having a source coupled to the drain of the first control transistor, a drain that serves as an output of the output buffer, and a gate that receives a first biasing input;

a second breakdown prevention transistor having a drain coupled to the drain of the first breakdown prevention transistor, a source, and a gate that receives a second biasing input; and a second control transistor having a drain coupled to the source of the second breakdown prevention transistor, a source coupled to a reference voltage, and a gate that receives a second control input.

10. The integrated circuit of claim 9, further comprising a control input generation circuit that receives an output signal from the core circuit and that produces the first control input and the second control input.

11. The integrated circuit of claim 9, wherein the at least two voltage domains includes a 1.2 volts voltage domain and a 3.3 volts voltage domain.

12. The integrated circuit of claim 11, wherein the core supply voltage is 1.2 volts.

* * * * *